United States Patent [19]

Itoh

[11] 4,389,573
[45] Jun. 21, 1983

[54] PULSED ELECTRON BEAM DEVICE COMPRISING A CATHODE HAVING THROUGH HOLES

[75] Inventor: Tadatsugu Itoh, Tokyo, Japan
[73] Assignee: Anelva Corporation, Tokyo, Japan
[21] Appl. No.: 233,858
[22] Filed: Feb. 12, 1981

[30] Foreign Application Priority Data

Feb. 14, 1980 [JP] Japan .................................. 55-16850
Nov. 26, 1980 [JP] Japan .................................. 55-165247

[51] Int. Cl.³ .......................... H01J 3/00; H01J 33/00
[52] U.S. Cl. ................................ 250/492.2; 250/492.3
[58] Field of Search ............... 250/492 R, 492 A, 310, 250/427, 492.2, 492.3, 400; 313/360, 362, 363; 219/121 EL

[56] References Cited

U.S. PATENT DOCUMENTS 2,856,532 10/1958 Martina ............................... 250/427
3,192,892 7/1965 Hanson et al. ....................... 250/427
3,950,187 4/1976 Kirkpatrick .
4,321,470 3/1982 Kaplan et al. ..................... 250/492.2
4,335,314 6/1982 Geerk et al. ...................... 250/492.3

*Primary Examiner*—Bruce C. Anderson
*Attorney, Agent, or Firm*—Laff, Whitesel, Conte & Saret

[57] ABSTRACT

In a gas-filled space, a pulsed electron beam device comprises a cathode provided with through holes, a filament on one side of the cathode, and an anode on the other side with a sample to be processed held thereon. Electrons emitted by the filament are momentarily directed to the cathode so that a portion thereof may trigger a discharge in a space between the anode and cathode. The discharge ceases in a moment, meanwhile providing electron beams to uniformly process the sample. The cathode may comprise either a single plate of graphite or a combination of a graphite plate and an aluminum plate. Preferably, a net electrode is placed between the cathode and the anode and electrically connected to the anode.

6 Claims, 3 Drawing Figures

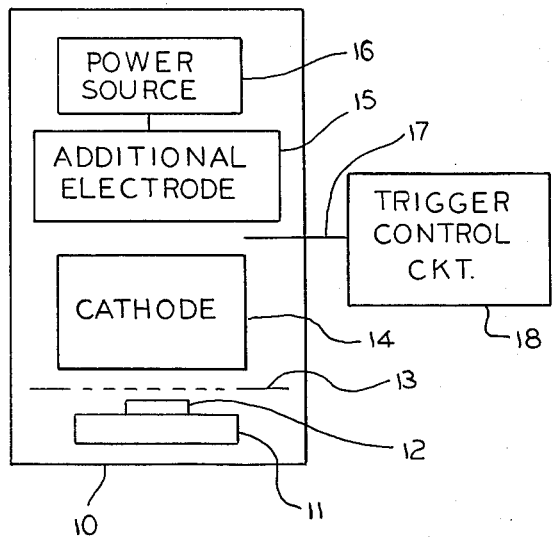
FIG. 1
(PRIOR ART)
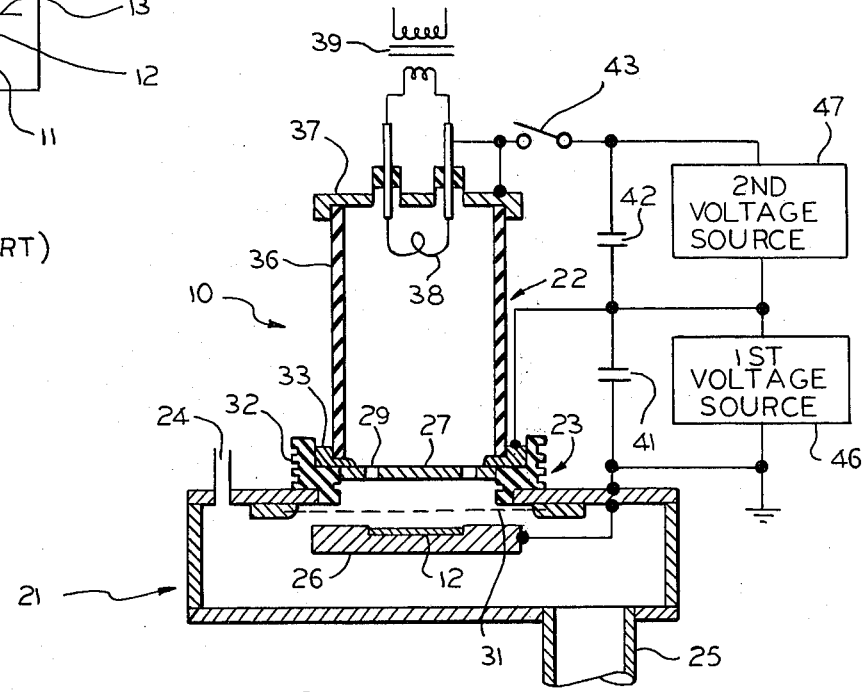
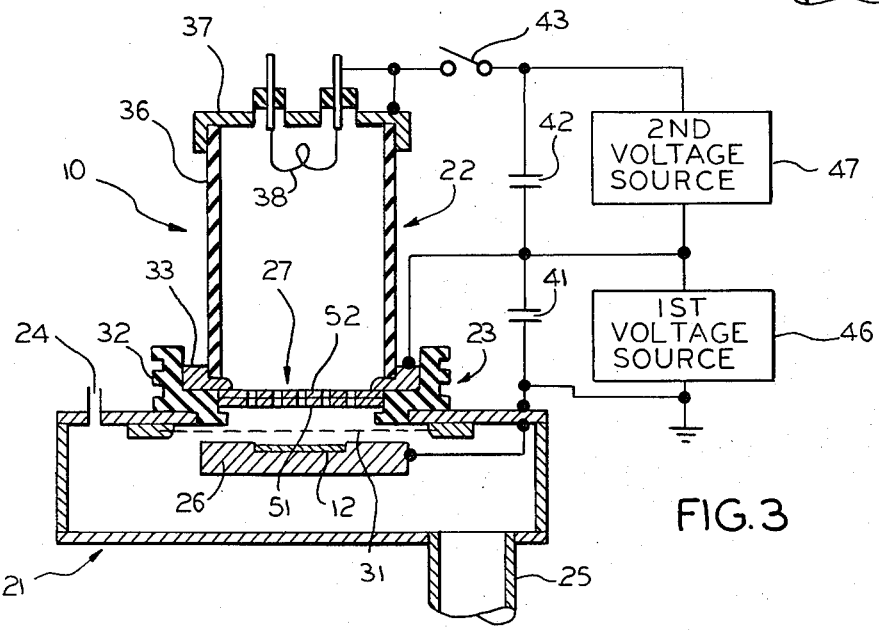
FIG. 3

PULSED ELECTRON BEAM DEVICE COMPRISING A CATHODE HAVING THROUGH HOLES

BACKGROUND OF THE INVENTION

This invention relates to a device for momentarily working a sample by a single pulse of electron beams. In other words, this invention relates to a pulsed electron beam device for processing a sample by pulsed electron beams. Although a semiconductor wafer will be described as the sample throughout the instant specification, the samples may be other things as, for example, ceramics or the like.

On fabricating a semiconductor device on a semiconductor wafer, ion implantation is often carried out to form a shallow impurity area adjacently of a surface of the wafer. Such ion implantation inevitably gives rise to distortion or defects in crystal structure of a surface region of the wafer. The defects in crystal structure deteriorate characteristics of the fabricated semiconductor device. To temper the defects in crystal structure, the surface region of the wafer may be annealed by heat treatment. However, such heat treatment should rapidly be carried out in a very short duration of, for example, 1 microsecond or less. Otherwise, diffusion unfavorably takes place from the impurity area during the heat treatment.

A pulsed electron beam device is suitable for momentarily processing the wafer to temper the crystal defects without any diffusion. With the electron beam device, it is preferable that the whole of the surface region is uniformly processed by electron beams at a time. In other words, the electron beams should uniformly be emitted to the whole surface region with uniform electron density. For this purpose, a conventional pulsed electron beam device is supplied with high voltage more than 100 kilovolts as will later be described with reference to one of a few figures of the accompanying drawing. Handling of the device is troublesome owing to such high voltage. Moreover, only a little of the high voltage contributes to generation of the electron beams. Efficiency has therefore been very low.

SUMMARY OF THE INVENTION

It is an object of this invention to provide a pulsed electon beam device which is capable of uniformly processing a sample at a time.

It is another object of this invention to provide a pulsed electron beam device of the type described, in which a comparatively low voltage is used to form electron beams.

It is another object of this invention to provide a pulsed electron beam device of the type described, which has a high efficiency.

According to this invention, a pulsed electron beam device is for use in momentarily processing a sample by electron beams. The electron beam device comprises a chamber defining a hollow space filled with a predetermined gas, a first electrode member placed in the space and having a principal surface for supporting the sample, and a second electrode member located in the space and having a first surface directed to the principal surface with a gap left therebetween and a second surface opposite to the first surface. The second electrode member has a predetermined number of through holes extending between the first and the second surfaces. The device further comprises a third electrode member directed to the second surface in the space and being capable of emitting electrons, first voltage providing means for providing a first voltage between the first and the second electrode members, with the first and the second electrode members kept at a first electric potential and a second electric potential negative relative to the first electric potential by the first voltage, respectively, and second voltage providing means for momentarily providing a second voltage between the second and the third electrode members, with the third electrode member momentarily given a third electric potential negative relative to the second electric potential by said second voltage, respectively. The second voltage thereby makes a portion of the electrons emitted by the third electrode member pass through the through holes and momentarily produce the electron beams between the first and the second electrode members.

BRIEF DESCRIPTION OF THE DRAWING

FIG. 1 shows a schematic block diagram of a conventional pulsed electron beam device;

FIG. 2 shows an axial sectional view of a pulsed electron beam device according to a first embodiment of this invention; and FIG. 3 shows a similar view of a pulsed electron beam device according to a second embodiment of this invention, with a heater source removed therefrom.

DESCRIPTION OF THE PREFERRED EMBODIMENTS

Referring to FIG. 1, a conventional pulsed electron beam device will be described for a better understanding of this invention. The device comprises a chamber 10 defining a hollow space filled with a gas and a support or platform 11 located in the hollow space. The support 11 is for supporting a sample or semiconductor wafer 12 to be processed by the electron beam device and is movable by the use of a support controller (not shown). The electron beam device comprises an anode 13 over the support 11, a cathode 14 spaced from the anode 13 with a first gap left between the anode 13 and the cathode 14, and an additional electrode 15 spaced from the cathode 14 with a second gap left between the cathode 14 and the additional electrode 15. The additional electrode 15 is connected to an electric power source 16 for supplying the additional electrode 15 with a high voltage higher than 100 kilovolts. A trigger electrode 17 is placed in the second gap and is controlled by a trigger control circuit 18.

When the trigger electrode 17 is energized through the trigger control circuit 18 with the additional electrode 15 kept at the high voltage, an initial discharge occurs in the second gap between the additional electrode 15 and the cathode 14. Subsequently, a main discharge is induced in the first gap between the cathode 14 and the anode 13. As a result, electron beams appear a short duration of, for example, 1 microsecond or less between the cathode 14 and the anode 13. The electron beams are irradiated through the anode 13 on the semiconductor wafer 12 to momentarily process or anneal the same.

With this electron beam device, electric energy supplied to the additional electrode 15 is discharged through the first and the second gaps with the cathode 14 and the anode 13 interposed between the additional electrode 15 and the support 11. This means that only a little of the energy, for example, about ten percent of the energy is effectively utilized to cause the electron beams to occur in the first gap. In addition, handling of the electron beam device is not easy owing to such high voltage. Thus, the conventional electron beam device is disadvantageous as pointed out in the preamble of the instant specification.

Practically, it is often necessary to control energy of the electron beams in order to fabricate a desirable semiconductor device from the wafer 12. In this case, both of the initial and the main discharges should be controlled in the conventional electron beam device. Such control is not readily feasible. Therefore, the first and the second gaps should empirically be determined.

Referring to FIG. 2, a pulsed electron beam device according to a first embodiment of this invention is for use momentarily processing or annealing a semiconductor wafer 12 and comprises a chamber 10 defining a hollow space, as is the case with the conventional electron beam device illustrated in FIG. 1. In the example being illustrated, the hollow space has an inverted configuration of a figure of T comprising a horizontal space and a vertical space upwardly projected from the horizontal space. The vertical space is a cylindrical one having a center axis.

The chamber 10 comprises a bottom portion 21 defining the horizontal space, an upright portion 22 extended upwards from the bottom portion 21, and an intermediate portion 23 between the bottom and the upright portion 21 and 22. The upright and the intermediate portions 22 and 23 define the vertical space.

The bottom portion 21 is electrically conductive. A gas inlet pipe 24 and a gas exhaust pipe 25 are connected to the bottom portion 21. The hollow space is evacuated and then filled with a rare gas, such as helium, to pressures between $10^{-3}$ and $10^{-5}$ Torr.

A first electrode member 26 is held in the horizontal space by means not shown and electrically connected to the bottom portion 21. The first electrode member 26 is formed by an aluminum plate having a diameter of 150 millimeters. The plate has a center portion directed to the vertical space and recessed from the remaining portion of the plate. The recessed center portion provides a principal surface for supporting the semiconductor wafer 12 and serves to stably hold the wafer 12 during processing. The size of the center portion is determined in correspondence to that of the wafer 12. In an example, the center portion is about 100 millimeters in diameter. The first electrode member 21 is operated as a part of the anode described in conjunction with FIG. 1 as will later become clear.

A second electrode member 27 has a first surface directed downwardly to the principal surface of the first electrode member 26, a second surface opposite to the first surface, and a predetermined number of through holes 29 extending between the first and the second surfaces. In the example being illustrated, the second electrode member 27 is constituted by a single plate of graphite having a thickness of about 2 millimeters and the predetermined number is equal to six. Each of the six through holes is 3 millimeters in diameter and is azimuthally equally spaced on the second electrode member 27 on a preselected circumference drawn along the center axis of the vertical space. The second electrode member 27 is located in the vertical space with a gap left between the principal and the first surfaces and is attached to the intermediate portion 23. The gap is 25 millimeters long in the embodiment being illustrated.

A net electrode 31 of, for example, tungsten or tantalum is located between the first and the second electrode members 26 and 27 and is electrically connected to the bottom portion 21. A distance between the net electrode 31 and the principal surface is 5 millimeters in the illustrated embodiment. The net electrode serves as the anode similar to that illustrated in FIG. 1 in combination with the first electrode member 26.

The intermediate portion 23 of the chamber 10 comprises a cylindrical insulator 32 for insulating the second electrode member 27 from the bottom portion 21. The insulator 32 has inside and outside parts nearer to and farther from the vertical space, respectively. The inside part is extended from a periphery of the vertical space outside the upright portion 22 of the chamber 10. The outside part is projected upwards from the inside part. A ring-shaped conductor 33 is laid on the inside part. The conductor 33 is electrically connected to the second electrode member 27 to electrically lead the second electrode member 27 outside of the vertical space.

The upright portion 22 of the chamber 10 comprises a cylindrical wall member 36 of an insulator, such as silica, which is placed on the inside part of the cylindrical insulator 32 with the conductor 33 interposed between the insulator 32 and the wall member 36. The upright portion 22 further comprises a cap member 37 of a conductor attached to the wall member 36 to envelop the vertical space in combination with the wall member 36.

A filament 38 is directed in the vertical space to the second surface of the second electrode member 27 through the cap member 37, with an insulator interposed between the filament 38 and the cap member 37. Preferably, the filament 38 should be excellent in thermal electron emission and, therefore, it is of tungsten in this embodiment. A distance between the filament 38 and the second surface is selected at 200 millimeters. A heater source 39 is coupled to the filament 38 outside the vertical space to heat the filament 38, the cap member 37. The filament 38 and the heater 39 are operable as a third electrode member.

Further referring to FIG. 2, the pulsed electron beam device comprises a first capacitor 41 electrically connected to the first electrode member 26 and to the second electrode member 27 through the ring-shaped conductor 33. A second capacitor 42 is connected to the first capacitor 41 in series. The second capacitor 42 is electrically connected to the filament 38 through a switch 43. The first and the second capacitors 41 and 42 have capacities of, for example, about 1.5 and 1 microfarad, respectively. The first capacitor 41 is supplied with a first voltage adjustable between 5 and 20 kilovolts from a first voltage source 46 while the second capacitor 42, with a second voltage of, for example, 3 kilovolts from a second voltage source 47. The first voltage is impressed between the first and the second electrode members 26 and 27 through the first capacitor 41. The bottom portion 21 is grounded together with a positive terminal of the first voltage source 46 and one terminal of the first capacitor 41. The first electrode member 26 is, therefore, kept at ground or a first electric potential while the second electrode member 27, a second electric potential negative relative to the first electric potential. Thus, a combination of the first capacitor 41 and the first voltage source 46 is put into operation to provide the first voltage between the first and the second electrode members 26 and 27. Preferably, each of the first and the second capacitors 41 and 42 is a combination of a plurality of capacitors which are connected in parallel and azimuthally spaced around the cylindrical wall member 36. This serves to reduce any inductances accompanied by connections.

After the second capacitor 42 is enough charged up by the second voltage source 47, the switch 43 is turned on to supply the second voltage momentarily between the second electrode 27 and the filament 38 a short duration of 1 microsecond or less. During presence of the second voltage, the filament 38 is rapidly reduced to a third electric potential negative relative to the second electric potential, with the first and the second electric members 26 and 27 supplied with the first voltage. Thus, a combination of the second capacitor 42, the second voltage source 47, and the switch 43 serves to provide the second voltage between the second electrode member 27 and the filament 38.

The filament 38 momentarily emits a great deal of electrons toward the second electrode member 27 during presence of the second voltage. The electrons travel through the vertical space and reach the second electrode member 27. Inasmuch as the second electrode member 27 is provided with the through holes 29, the electrons partly pass through the through holes 29 and enter into the gap between the first and the second electrode members 26 and 27. As a result, the electrons trigger a gas discharge in the gap. The first capacitor 41 is momentarily discharged to cause electron beams to occur in the gap. The electron beams are emitted to the semiconductor wafer 12. The wafer 12 is processed or annealed by the electron beams. Since the duration of the electron beams is very short, namely, at most 1 microsecond, the wafer 12 is rapidly worked only in a portion adjacent to a surface thereof without any diffusion of impurities.

In FIG. 2, the second electrode member 27 may comprise a copper layer and a gold layer plated on the copper layer, instead of a graphite plate. In other words, use is unfavorable of the copper plate alone. This is because discoloration takes place on the copper plate by iterative use thereof. Preferably, the electron beams should uniformly be generated from the second electrode member 27 and uniformly emitted to the wafer 12. The net electrode 31 serves to uniformly disperse the electron beams directed to the wafer 12. As regards the second electrode member 27, it is preferable to reduce diameters of the through holes 29 and to increase them in number so as to uniformly generate the electron beams. In addition, consideration should be given to the thickness of the second electrode member 27 and the diameter of the holes 29. This is because an electric field produced between the first and the second electrode members 26 and 27 leaks through the through holes 29 into the vertical space 22. The leakage field disturbs the electrons directed from the filament 38 to the second electrode member 27. It has been confirmed that influence of the leakage is dependent on the thickness of the second electrode member 27 and the diameters of the through holes 29. The diameters of the through holes 29 may be expanded as the second electrode member 27 becomes thick. However, it becomes difficult for the electrons to pass through the through holes 29 with an increase of the thickness of the second electrode member 27. In this respect, it is necessary to thin the second electrode member 27. According to an experimental study, through holes 29 should preferably have a diameter not greater than 5 millimeters when the second electrode member 27 is 2 millimeters thick.

Referring to FIG. 3, a pulsed electron beam device according to a second embodiment of this invention is similar to that illustrated with reference to FIG. 2 except that the second electrode member 27 comprises a first plate 51 of graphite directed to the first electrode member 26 and a second plate 52 of aluminum directed to the filament 38. The first plate 51 has a first front surface and a first back surface opposite to the first front surface while the second plate, a second front surface and a second back surface opposite to the second front surface. The first back surface is attached to the second front surface. As a result, the first front surface and the second back surface define the first and the second surfaces of the second electrode member 27, respectively. A lot of through holes 29 are formed through the first and the second plates 51 and 52.

The second plate 52 has a resistance lower than that of the first plate 51 because aluminum is lower in the sheet resistance than graphite. The second plate 52 is brought into electrical contact with the ring-shaped conductor 33 connected to the first capacitor 41. Therefore, the first plate 51 is wholly kept at a substantially equal electric potential by virtue of the second plate 52. This means that a uniform electric field is produced between the first and the second electrode members 26 and 27 and that the electron beams are uniformly emitted from the first plate 51 in the direction of the first electrode member 26 without any unbalanced distribution of the electron beams.

Inasmuch as use is made of the first plate 51 of graphite, the first plate 51 has a good conductivity, a high melting point, and is resistive to any gases which may appear in the hollow space.

With this embodiment, it is possible to generate electron beams with substantially uniform electron density even when the net electrode member 31 is removed. In addition, it has been confirmed that a thick first electrode member 26 is effective to make the electron beams uniform on the wafer 12.

According to the inventor's experiment, a uniform electron beam distribution is attained on condition that a voltage between 5 and 13 kilovolts is impressed between the first and the second electrode members 26 and 27 and that a pressure of helium gas is kept at $5 \times 10^{-3}$ Torr. Likewise, a uniform electron beam distribution appears when a pressure of helium gas is $1 \times 10^{-4}$ Torr and the first voltage is varied between 5 and 10 kilovolts. From this fact, it is understood that a variable range of the first voltage becomes wide as a gas pressure becomes low. Desirable heat treatment is possible without any unduly diffusion of impurities doped in the wafer 12 at the pressures of between $5 \times 10^{-4}$ and $5 \times 10^{-6}$ Torr even when the voltage between the first and the second electrode members 26 and 27 is not more than 10 kilovolts. It has been confirmed that the wafer 12 is not subjected to any damages on its surface by the use of the device according to this embodiment.

While this invention has thus far been described in conjunction with a few embodiments thereof, it will be readily possible for those skilled in the art to put the invention into practice in various manners. For example, the pressures, the first and the second voltages, and the distances between the respective electrodes may be variable as occasion demands, considering collisions of electrons, ions, and molecules in the hollow space. Inasmuch as the electron beam device according to this invention readily and precisely controls the electron beams, it may be used for crystal growth. When the semiconductor device comprises a semiconductor wafer and a metal film attached to the wafer, it is possible with this electron beam device to heat an interface between the semiconductor device and the metal film in order to improve electrical contact therebetween.

What is claimed is:

1. A pulsed electron beam device for use in momentarily processing a sample by electron beams, said electron beam device comprising:

a chamber defining a hollow space filled with a predetermined gas;

a first electrode member placed in said space and having a principal surface for supporting said sample;

a second electrode member located in said space and having a first surface directed to said principal surface with a gap left therebetween and a second surface opposite to said first surface, said second electrode member having a predetermined number of through holes extending between said first and said second surfaces;

a third electrode member directed to said second surface in said space and being capable of emitting electrons;

first voltage providing means for providing a first voltage between said first and said second electrode members, with said first and said second electrode members kept at a first electric potential and a second electric potential negative relative to said first electric potential by said first voltage, respectively; and second voltage providing means for momentarily providing a second voltage between said second and said third electrode members, with said third electrode member momentarily given a third electric potential negative relative to said second electric potential by said second voltage, respectively, said second voltage thereby making a portion of the electrons emitted by said third electrode member pass through said through holes and momentarily produce said electron beams between said first and said second electrode members.

2. A pulsed electron beam device as claimed in claim 1, wherein said second electrode member comprises a single plate of a conductor.

3. A pulsed electron beam device as claimed in claim 2, wherein said conductor is graphite.

4. A pulsed electron beam device as claimed in claim 1, wherein said second electrode member comprises a first plate of graphite defining said first surface and a second plate of a metal attached to said first plate and defining said second surface.

5. A pulsed electron beam device as claimed in claim 4, wherein said metal is aluminum.

6. A pulsed electron beam device as claimed in any one of claims 1, 2, 3, 4, or 5 further comprising a net electrode located between said first and said second electrode members, said net electrode being connected to said first voltage providing means together with said first electrode member.

* * * * *